(12) United States Patent
Maruyama (10) Patent No.: US 7,133,466 B2
(45) Date of Patent: Nov. 7, 2006

(54) AMPLIFYING APPARATUS (75) Inventor: Satoshi Maruyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/999,207

(22) Filed: Nov. 24, 2004

(65) Prior Publication Data
US 2005/0141640 A1   Jun. 30, 2005

Related U.S. Application Data (63) Continuation of application No. PCT/JP02/05341, filed on May 31, 2002.

(51) Int. Cl.
H04K 1/02 (2006.01)
H04L 25/03 (2006.01)
H04L 25/49 (2006.01)

(52) U.S. Cl. .................................... 375/297
(58) Field of Classification Search ............... 375/297, 375/295, 311
See application file for complete search history.

(56) References Cited

U.S. PATENT DOCUMENTS 5,915,213 A * 6/1999 Iwatsuki et al. ............ 455/116
5,986,500 A   11/1999 Park et al.
2002/0097811 A1* 7/2002 Kubo et al. ................. 375/296

FOREIGN PATENT DOCUMENTS

| JP | 05-145357 | 6/1993 |
|---|---|---|
| JP | 10-022755 | 1/1998 |
| JP | 10-233629 | 9/1998 |
| JP | 2000-077951 | 3/2000 |
| JP | 2000-508149 | 6/2000 |
| JP | 2000-201040 | 7/2000 |
| JP | 2001-024457 | 1/2001 |

OTHER PUBLICATIONS

International Search Report dated Sep. 10, 2002.

* cited by examiner

*Primary Examiner*—Chien M. Fan
*Assistant Examiner*—Jia Lu
(74) *Attorney, Agent, or Firm*—Katten Muchin Rosenman LLP (57) ABSTRACT The present invention provides an amplifying apparatus including, two amplifiers for receiving input signals in common and for outputting their respective amplified signals, a combiner for combining the output signals of the two amplifiers and for outputting a combined signal, the amplifying apparatus which inhibit the distortion component in the output of amplifiers in the transition state. This amplifying apparatus comprises, a predistortion unit for determining a distortion compensation component based on the output of the combiner and for predistorting the input based on the determined distortion compensation component, and a gain control unit for attenuating the inputs to set lower than in the steady state by reducing the gain in the transition from two amplifier operation to one amplifier operation, or in the transition from one amplifier operation to two amplifier operation, or at the time of removal or attachment the amplifiers.

11 Claims, 6 Drawing Sheets

AMPLIFYING APPARATUS

CROSS-REFERENCE TO RELATED APPLICATION

The present application is a continuation of International Application No. PCT/JP02/05341 which was filed on May 31, 2002, which is herein incorporated by reference.

TECHNICAL FIELD

The present invention relates generally to an amplifying apparatus having two amplifiers each for amplifying a common input signal, and more particularly, to an amplifying apparatus for suppressing distortion components contained in output signals of the amplifiers in a transient state as in a transition from the state where both of the amplifiers operate to the state where either of the amplifiers operates.

BACKGROUND ART

Against a backdrop of the proliferation of mobile communication terminals such as mobile phones and increased demand for high-speed data services, it presents a significant challenge to boost the transmission output of base stations and improve the reliability thereof.

To boost the transmission output while at the same time improving the reliability of the base stations, a configuration including two transmission amplifiers is contemplated. One of the reasons is that combining signals amplified by the two amplifiers offers a substantially twice amount of transmission output as compared with a single amplifier. The other reason is that, even in the event of a fault of one amplifier, the other amplifier enables to continue signal transmission although the transmission output is halved, thus ensuring improved reliability.

With such amplifiers, on the other hand, amplification is conducted also in the nonlinear region of the amplification characteristic to obtain the output with high efficiency. Amplification in the nonlinear region of the amplification characteristic, however, results in a nonlinear distortion (distortion component) in the output signal of the amplifier. For this reason, a distortion compensating device is generally provided in the amplifiers to compensate for the nonlinear distortion.

Among such distortion compensating devices is a digital predistorter. The digital predistorter is designed to prepare a characteristic component (distortion compensation component, predictive distortion value) opposite to the distortion characteristic of the amplifier at the input side of the amplifier through digital processing and add this component to the input signal of the amplifier through digital processing. This cancels out the distortion component occurring in the amplifier, thus providing a distortion-free output signal from the amplifier.

Since the amplification characteristic varies from one amplifier to another, the distortion compensation component of the digital predistorter also varies from one amplifier to another. To obtain an appropriate distortion compensation component responsive to the amplification characteristic of the amplifier used, therefore, the amplifier must be operated for more than a given time, thus allowing the predistorter to find the distortion compensation component responsive to the amplification characteristic of the amplifier. For this reason, it takes a given time before the appropriate distortion compensation component is found and the distortion component in the amplifier's output signal is canceled out by the distortion compensation component.

In the configuration described at the beginning in which two amplifiers are provided, a condition occurs equivalent to that in which the amplification characteristic of the amplifiers changes because of a transition from the state where both of the amplifiers operate to the state where, as a result of a fault of one of the amplifiers, only one of the amplifiers operates. In this case, it requires a given time again before the distortion compensation component of the predistorter is changed into a value appropriate for the amplification characteristic of a single amplifier.

During the period of such a transient state, a signal containing a distortion component will continue to be output from the amplifier. This distortion component likely leads to failures including noise in the adjacent channels.

DISCLOSURE OF THE INVENTION

It is an object of the present invention to suppress distortion components contained in output signals of two amplifiers in a transient state as in a transition from the state where the signal amplification is handled by the two amplifiers to the state where the signal amplification is handled by one of the amplifiers.

An amplifying apparatus in accordance with an aspect of the present invention comprises two amplifiers for receiving input signals in common and for outputting their respective amplified signals; a combiner for combining the output signals of the two amplifiers and for outputting a combined signal; a predistortion unit for determining a distortion compensation component based on the output signal of the combiner, the predistortion unit for predistorting the input signal based on the determined distortion compensation component; and a gain control unit for attenuating the input signals to set lower than in the steady state by reducing the gain lower than a steady value in the transition from the state where both of the amplifiers operate to the state where either of the amplifiers operates, or in the transition from the state where either of the amplifiers operates to the state where both of the amplifiers operate, or at the time of removal of either of the amplifiers, or at the time of attachment of the removed amplifier.

According to the present invention, in a transient state associated with the transition from the state where the two amplifiers operate to the state where either of the amplifiers operates, the transition from the state where either of the amplifiers operates to the state where the two amplifiers operate, the removal of either of the amplifiers or the reattachment of either of the amplifiers that has been removed, the gain of the gain control unit is reduced lower than the steady value, attenuating the input signal input to the amplifiers to set lower than in the steady state. This ensures suppression of the distortion component in the output signals of the amplifiers in the aforementioned transient state.

An amplifying apparatus in accordance with another aspect of the present invention comprises two amplifiers for receiving input signals in common and for outputting their respective amplified signals; a combiner for combining the output signals of the two amplifiers and for outputting a combined signal; two predistortion units each for determining a distortion compensation component based on the output signal of the combiner, each of the predistortion units for predistorting the input signal based on the determined distortion compensation component; a switch unit for selecting one of output signals of the two predistortion units and for supplying the selected output signal to the two amplifiers in common; and a gain control unit for attenuating the signals input to the two amplifiers to set lower than in the steady state by reducing the gain lower than a steady value when changing over the switch unit from one of the predistortion units to the other.

According to the present invention, when the switch unit is switched from one predistortion unit to the other, the gain is reduced lower than the steady value, attenuating the input signal input to the two amplifiers to set lower than in the steady state. This ensures suppression of the distortion component in the output signals of the amplifiers during the switching.

An amplifying apparatus in accordance with a further aspect of the present invention comprises two amplifying units; a combiner for combining output signals of the two amplifying units and for outputting a combined signal; and a switch unit, each of the two amplifying units including a main amplifier; a digital predistorter disposed at the input side of the main amplifier, the digital predistorter generating a predictive distortion value of the main amplifier to add the generated predictive distortion value to input signals; a quadrature modulator for quadrature-modulating an output signal of the digital predistorter; an upconverter for converting the frequency of an output signal of the quadrature modulator; a downconverter for converting the frequency of an output signal of the combiner and for imparting the frequency-converted output signal of the combiner to the digital predistorter; and a gain control for receiving an output signal of the upconverter as input, the gain control unit attenuating the input signal to set lower than in the steady state by reducing the gain lower than a steady value in the transition from the state where both of the amplifying units operate to the state where either of the amplifying units operates, or in the transition from the state where either of the amplifying units operates to the state where both of the amplifying units operate, or at the time of removal of either of the amplifying units, or at the time of attachment of the removed amplifying unit, or at the time of changing over of the switch unit from one predistortion unit to the other predistortion unit, the switch unit selecting an output signal of one of the gain control units of the two transmission amplifying units to impart the selected output signal to the main amplifiers in common.

BEST MODE FOR CARRYING OUT THE INVENTION

<First Embodiment>

Figure 1:
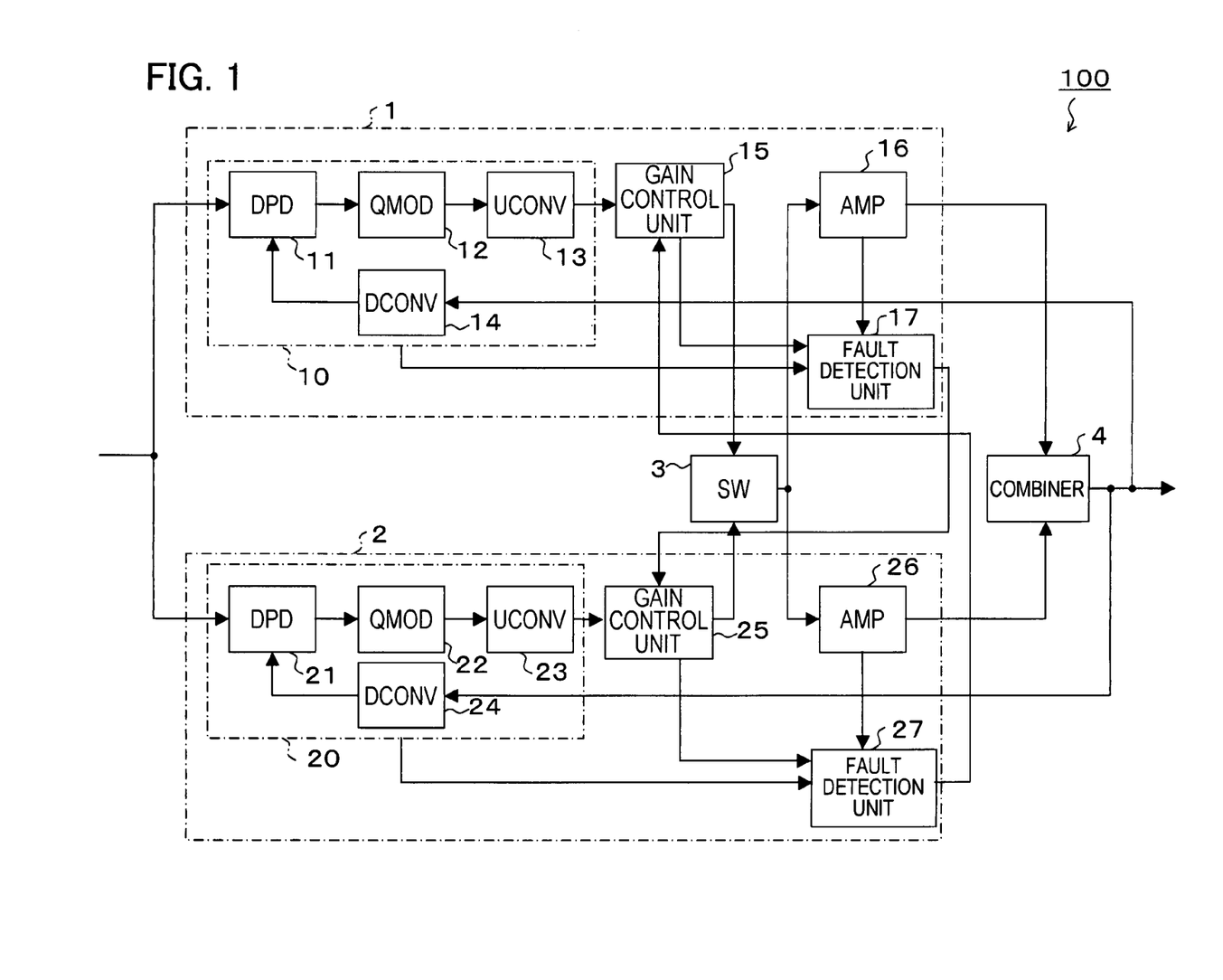
FIG. 1 is a block diagram showing a configuration of a transmission amplifying apparatus according to a first embodiment of the present invention.

FIG. 1 is a block diagram showing a configuration of a transmission amplifying apparatus 100 according to a first embodiment of the present invention. The transmission amplifying apparatus 100 is provided, for example, at a base station of a mobile communication system and employed to amplify transmission signals to a mobile communication terminal.

The transmission amplifying apparatus 100 has transmission amplifiers 1 and 2, a switch (SW) 3 and a combiner 4.

The transmission amplifier 1 has a modulation unit 10, a gain control unit 15, a main amplifier (AMP) 16 and a fault detection unit 17. The modulation unit 10 has a digital predistorter (DPD) 11, a quadrature modulator (QMOD) 12, an upconverter (UCONV) 13 and a downconverter (DCONV) 14. These components of the transmission amplifier 1 are integrated, for example, into a single circuit board (card) or package.

Having the similar configuration as the transmission amplifier 1, the transmission amplifier 2 has a modulation unit 20, a gain control unit 25, a main amplifier (AMP) 26 and a fault detection unit 27, with the modulation unit 20 having a DPD 21, a QMOD 22, a UCONV 23 and a DCONV 24. These components of the transmission amplifier 2 are also integrated into a single circuit board (card), package or the like.

In the transmission amplifying apparatus 100, the signal from the selected side (used side)—the modulation unit 10 or 20—is imparted to the SW 3 via the either of the gain control units 15 and 25 on the used side, thus supplying the signal to the two AMPs 16 and 26 from the SW 3. The two AMPs 16 and 26 each amplify the signal imparted from the SW 3 and output an amplified signal to the combiner 4. The combiner 4 combines the two signals from the AMPs 16 and 26 and outputs a combined signal to the antenna, etc. for transmission. Description will be given in detail below of the components of the transmission amplifying apparatus 100.

The transmission amplifiers 1 and 2 are each input with a signal to be amplified by the AMP 16 or 26 and to be transmitted (transmission signal), from the device at the previous stage that is not shown. The transmission signal is imparted respectively to the modulation units 10 and 20.

The DPD 11 (21) (symbol in the parentheses represents the symbol of the transmission amplifier 2 or a component of the transmission amplifier 2; same applies hereinafter) is input with the transmission signal from the device at the previous stage that is not shown and a feedback signal from the DCONV 14 (24).

Among the transmission signals are signals transmitted to a mobile communication terminal (e.g., audio, data, image and control signals) and intermediate-frequency (IF) digital signals (I signal or in-phase component and Q signal or quadrature component). The feedback signal is derived by converting the radio-frequency (RF) analog output signal of the combiner 4 to an intermediate frequency with the DCONV 14 (24) (downconversion) and by converting this signal to a digital signal (A/D conversion).

The DPD 11 (21) has a distortion compensation table storing distortion compensation values for compensating for the distortion component in the output signal of the combiner 4, and an adder for adding a distortion compensation value in the distortion compensation table to the transmission signal. The DPD 11 (21) outputs the transmission signal after adding the distortion compensation value (predictive distortion value ) responsive to the power value of the transmission signal to the transmission signal. The distortion component in the output signal of the combiner 4 is added at the AMPs 16 and 26 when neither of the transmission amplifiers 1 and 2 is faulty (hereinafter referred to as "normal state"), and only at either the AMP 16 or 26 on the side that is not faulty if the transmission amplifier 1 or 2 is faulty (hereinafter referred to as "faulty state").

The distortion compensation value is found by the DPD 11 (21) based on the transmission and feedback signals (e.g., difference between the transmission and feedback signals). For this reason, it requires a given time from when the transmission amplifying apparatus 100 begins to operate, to when the distortion component in the output signal of the combiner 4 converges into the allowable range as a result of canceling out the distortion component with a distortion compensation value after the appropriate distortion compensation value is found that is responsive to the amplification characteristic of the AMP 16 and/or AMP 26. In the same manner, at the time of transition from the normal state to the faulty state or at the time of restoration to the normal state from the faulty state, it requires a given time until the distortion component converges into the allowable range as a result of canceling out the distortion component with a distortion compensation value after the appropriate distortion compensation value is found.

The QMOD 12 (22) quadrature-modulates the output signal of the DPD 11 (21) (I and Q signals), imparting the resulting signal to the UCONV 13 (23). The UCONV 13 (23) converts the digital signal imparted by the QMOD 12 (22) to an analog signal and converts the frequency of the analog signal from intermediate frequency to radio frequency (upconversion). The analog signal converted to radio frequency is imparted to the gain control unit 15 (25). It is to be noted that the function to convert a digital signal to an analog signal (D/A conversion capability) maybe possessed by the QMOD 12 (22).

Having a variable attenuator, the gain control unit 15 (25) attenuates the level (power) of the analog signal from the UCONV 13 (23) to a set gain (attenuation amount), imparting the attenuated analog signal to the SW 3. The gain of the gain control unit 15 (25) is, for example, set to 0 dB as steady value in the normal state. Therefore, the analog signal from the modulation unit 10 (20) is neither attenuated nor amplified in the normal state.

On the other hand, upon receiving a selection signal (described later) from the control device that is not shown or a fault detection signal (described later) from the fault detection unit 27 {17} of the other transmission amplifier 2 {1} (symbol in the braces represents the symbol of the transmission amplifier 1 or a component of the transmission amplifier 1; same applies hereinafter), the gain control unit 15 (25) reduces the gain from the steady value to a given value G, attenuating the power of the analog signal from the modulation unit 10 (20) and imparting the resulting signal to the SW 3.

The fault detection unit 17 (27) monitors the corresponding transmission amplifier 1 (2), detecting the fault in the amplifier and imparting a fault detection signal to the gain control unit 25 {15} of the other transmission amplifier 2 {1} and the control device (illustration omitted). Fault varies ranging from the entire fault of the modulation unit 10 (20), the gain control unit 15 (25) and the AMP 16 (26) to the fault of at least one of these components, all of which are detected by the fault detection unit 17 (27). The operation of the transmission amplifying apparatus 100 at the time of fault detection will be described later.

It is to be noted that these faults can be detected from the fact that the ratio of the input level (power value) of the modulation unit 10 (20) and the output level (power value) of the AMP 16 (26) differs from the amplification ratio (gain) value by monitoring these input and output values, or from the fact that the voltage of a specific transistor of the AMP 16 (26) becomes abnormal by monitoring this voltage.

The SW 3 is input with a selection signal, from the control device that is not shown, instructing the selection of the output signal of either the gain control unit 15 or 25. The SW 3 selects the output signal of either the gain control unit 15 or 25, supplying the output signal commonly to the two AMPs 16 and 26.

It is to be noted that the SW 3 can be configured with a relay. The SW 3 may alternatively be configured with a combiner for combining the signals imparted from the gain control units 15 and 25, with power supply to the unselected side (unused side)—either the gain control unit 15 or 25—halted (power turned off). This also prevents the signal from the gain control unit on the side to which power supply has been halted, while at the same time allowing only the signal from the gain control unit on the used side to be supplied to the SW 3. Thus it becomes possible to supply the signal from the used side—either the gain control unit 15 or 25—commonly to the AMPs 16 and 26. It is to be noted that the control device halts power supply. In addition, power supply may be halted by the modulation unit 10 or 20, or by the UCONV 13 or 23 alone, a component of the modulation unit 10 or 20.

The AMP 16 (26) amplifies the signal supplied from the SW 3, imparting the amplified signal to the combiner 4. The combiner 4 combines the signals from the AMPs 16 and 26, outputting the combined signal. The combined signal is, for example, transmitted to a mobile communication terminal with radio wave from the antenna that is not shown, while part of the combined signal is fed back to the DCONVs 14 and 24.

Next, description will be given of the operation of the transmission amplifying apparatus 100 having such a configuration.

In the normal state, a transmission signal input to the transmission amplifiers 1 and 2 is predistorted and modulated by the modulation units 10 and 20, and then imparted respectively to the gain control units 15 and 25. Since the gains of the gain control units 15 and 25 are set to 0 dB as steady value, the signals from the modulation units 10 and 20 are imparted to the SW 3 without being attenuated and amplified. The SW 3 selects the signal from the used side—either the gain control unit 15 or 25—based on the selection signal of the control device, supplying the signal to the AMPs 16 and 26. After the signals supplied to the AMPs 16 and 26 are each amplified and then combined together by the combiner 4, the combined signal is transmitted from the antenna that is not shown.

In this manner, as the transmission signal is amplified by the two AMPs 16 and 26 in the normal state, a substantially doubled transmission output as compared with a single amplifier can be obtain. Although a distortion component could be added to the output signals at the AMPs 16 and 26, the modulation units 10 and 20 cancel out the distortion component so that a distortion-free output signal is obtained.

If power supply is halted to the unused side—either the modulation unit 10 or 20, it is needless to say that the signal is neither predistorted nor modulated.

In the faulty state, on the other hand, the entire transmission amplifier found to be faulty is halted (power supply halted), or removed from the device or the like making up the base station for replacement after the halt. The transmission signal is predistorted, modulated and amplified only in the fault-free transmission amplifier.

Occurrence of a fault can be classified into two cases; one is in which the used side—the transmission amplifier 1 or 2—becomes faulty (first case) and another case is in which the unused side becomes faulty (second case).

When, in the first case, the transmission amplifier 1 is the used side, the fault detection unit 17 that has detected a fault (i.e., the fault detection unit on the used side) imparts a fault detection signal to the gain control unit 25 on the other side (i.e., gain control unit on the unused side) and the control device (illustration omitted).

The gain control unit 25 reduces the gain from the steady value to the given value G for a given time T after the reception of the fault detection signal (gain reduction control). On the other hand, the control device halts the entire transmission amplifier found to be faulty (e.g., halts power supply) while at the same time imparting to the SW 3 a selection signal instructing the selection of the signal from the gain control unit 25 of the transmission amplifier 2. It is to be noted that if power supply is halted to the modulation unit 20 on the unused side, the control device begins to supply power to the modulation unit 20.

This switches between the used and unused sides, resulting in that the gain control unit 25 attenuates the signal predistorted and modulated by the modulation unit 20. The resulting signal is then imparted to the AMP 26 (AMP 16 halted) via the SW 3 for amplification. In the given time T, the gain control unit 25 restores the gain value to the steady value (gain restoration control).

In the second case, the fault detection unit 27 on the unused side that has detected a fault imparts a fault detection signal to the gain control unit 15 and the control device. The gain control unit 15 sets the gain to the given value G lower than the steady value for the given time T after the reception of the fault detection signal. On the other hand, although halting the entire transmission amplifier 2, the control device does not impart a selection signal to the SW 3 because the fault-free transmission amplifier 1 is the used side from the beginning.

This results in the signal, predistorted and modulated by the modulation unit 10, being attenuated by the gain control unit 15 and imparted to the AMP 16 (AMP 26 halted) for amplification. In the given time T, the gain control unit 25 restores the gain value to the steady value.

It is to be noted that, in the first and second cases with the transmission amplifier 2 being the used side, the similar processings are performed with the exception that the transmission amplifiers 1 and 2 change places. On the other hand, if power supply is halted to the modulation unit, etc. on the unused side, switching to the used side allows the control device to begin to supply power.

In this manner, the distortion component in the output signal of the combiner 4 can be suppressed by reducing the gain of the gain control unit 15 or 25 on the used side lower than the steady value immediately after a fault.

That is, a situation occurs equivalent to that in which the amplifier's amplification characteristic changes because of a transition from the amplification using the two AMPs 16 and 26 in the normal state to the amplification using either the AMP 16 or 26. This renders the distortion compensation value—a value used in the amplification with the AMPs 16 and 26—unable to sufficiently compensate for the distortion component. On the other hand, if, in the first case, control is performed to halt power supply to the modulation unit 20 on the unused side, the modulation unit 20 to be switched from the unused to used sides does not have a distortion compensation value itself because the modulation unit 20 was not operating before the occurrence of the fault. Therefore, if the signal is amplified immediately after the occurrence of the fault without reducing the gain, the distortion component of the AMP is added to the output signal of the combiner 4, leading, for example, to noise in the adjacent channels due to this distortion component. On the other hand, such a situation can be avoided by reducing the gain value to the given value G.

Therefore, the "given value G" to which the gain value is reduced is preferably a value that allows the AMP 16 or 26 in operating condition to amplify a signal in the linear region of the amplification characteristic. However, since a transmission output is also needed that maintains communication with the mobile communication terminal, the given value G is a value that not only offers the transmission output maintaining communication with the mobile communication terminal but also keeps noise—noise imparted to the adjacent channels by the distortion component of the AMP 16 or 26—allowable (e.g., several dB). The specific value of the given value G is found by tests, experiments, simulation, etc. and set in advance in the gain control unit 15 or 25.

The "given time T" during which the gain value is reduced to the given value G is a time that allows the DPD 11 or 21 on the used side to set an appropriate compensation value with the single AMP in operating condition and that is required until the distortion component added by the AMP converges into the allowable range. The specific value of the given time T is found by tests, experiments, simulation, etc. and set in advance in the gain control unit 15 or 25.

Figure 2:
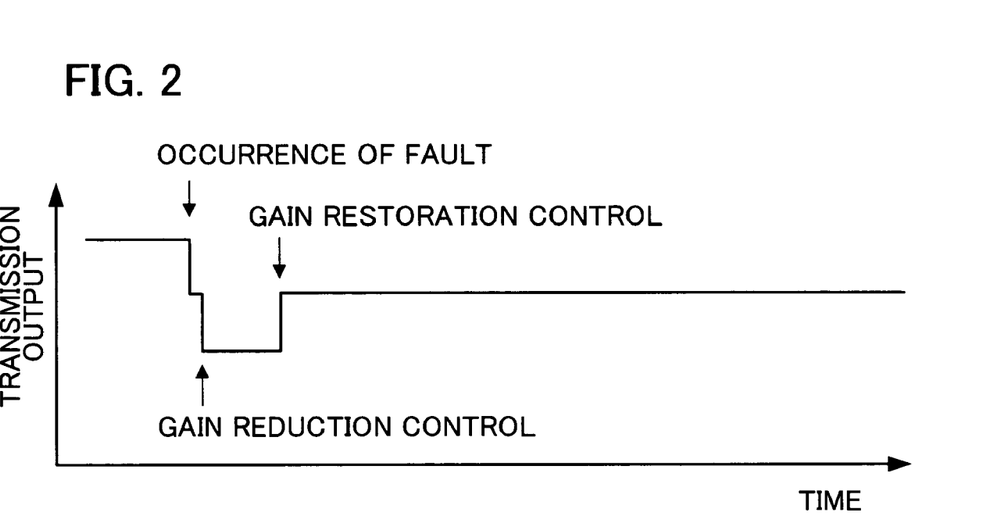
FIG. 2 is a graph showing changes in the transmission output from a combiner before and after a fault in the first embodiment of the present invention.

FIG. 2 is a graph showing changes in the transmission output (power value) from the combiner 4 before and after a fault. The transmission output from the combiner 4 declines by a constant value (e.g., 6 dB) immediately after the fault. This is a phenomenon that occurs because the output signal of the combiner 4 leaks not only into the antenna side but also partially into the side of the faulty transmission amplifier 1 or 2. Thereafter, the transmission output diminishes as a result of the reduction of the gain of the gain control unit 15 or 25 to the given value G. After the given time elapses, the gain of the gain control unit 15 or 25 is restored to the steady value, restoring the transmission output to the condition immediately after the fault in which the output is 6 dB lower.

The gain of the gain control unit 15 or 25 on the used side is reduced to the given value G for the duration of the given time T immediately after the removal also if the faulty transmission amplifier 1 or 2 is removed from the device and others making up the base station. Although the level of the output signal from the combiner 4 declines, for example, by 6 dB as described earlier as a result of the halting of power supply to the faulty transmission amplifier, the removal of this amplifier reduces the decline in the output signal level from the combiner 4 (e.g., by 3 dB). Thus, the removal also brings about a situation equivalent to that in which the AMP amplification characteristic changes. Therefore, a distortion component could occur at the time of removal, and the signal from the modulation unit is preferably attenuated until the distortion component is compensated for and canceled out by the distortion compensation value.

On the other hand, when a new transmission amplifier is attached after the removal, the similar gain control (gain reduction and restoration control) is performed on the gain control unit. The attachment of the new transmission amplifier results in a condition opposite to that at the time of removal, bringing about a situation equivalent to that in which the AMP amplification characteristic changes.

Further, when a transition occurs from the amplification using the single AMP to the amplification using the two AMPs following the attachment and after power is supplied to the attached transmission amplifier, the similar gain control is performed on the gain control unit. The reason is that a situation occurs equivalent to that in which the amplification characteristic changes also at the time of this transition.

It is to be noted that the removal and attachment of the transmission amplifier is detected by the control device (illustration omitted), with the gain control on the gain control unit performed by the control device. The detection of the removal and attachment can be performed, for example, by monitoring changes in the potential of a given terminal connected to the transmission amplifier (ground potential with the amplifier attached, open-circuit potential with the amplifier removed). The control device also performs the gain control on the attached transmission amplifier at power-up.

When switching takes place between the used and unused sides in the normal state, if power supply is halted to the modulation unit on the unused side, it is preferred to reduce the gain of the gain control unit—the unit to be switched from the unused to used sides—to the given value. The reason is that since power supply to the modulation unit is halted before the switching, the modulation unit does not have a pre-switching distortion compensation value.

In this manner, according to the transmission amplifying apparatus 100 of the first embodiment of the present invention, the distortion component can be suppressed in the event of a fault, at the time of removal of a transmission amplifier and at the time of switching in the normal state.

<Second Embodiment>

Figure 3:
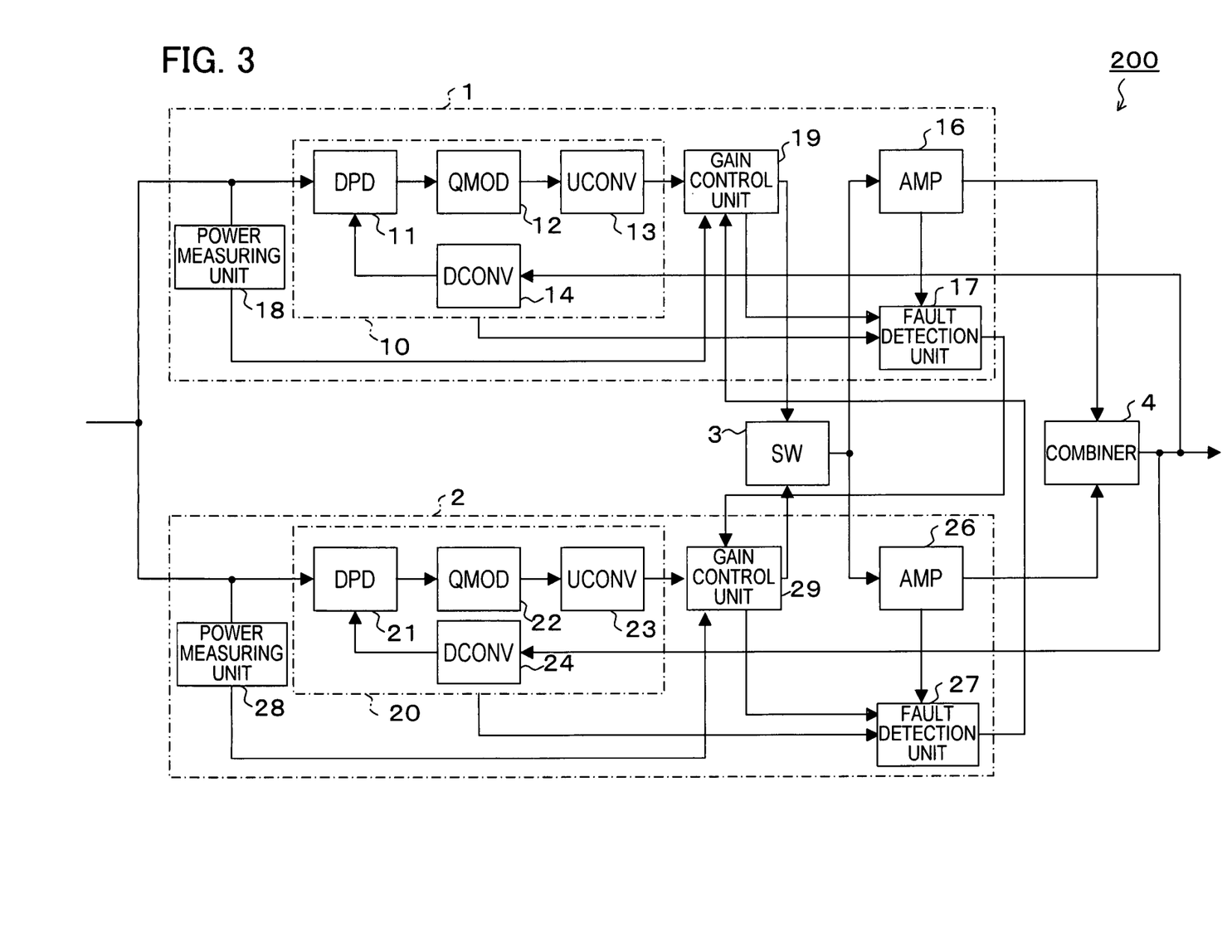
FIG. 3 is a block diagram showing a configuration of the transmission amplifying apparatus according to a second embodiment of the present invention.

FIG. 3 is a block diagram showing a configuration of a transmission amplifying apparatus 200 according to a second embodiment of the present invention. The same symbols are used for the same components as those of the transmission amplifying apparatus 100 according to the first embodiment described earlier, and the description of the components will be omitted.

The transmission amplifying apparatus 200 has, in addition to the components of the transmission amplifying apparatus 100, a power measuring unit 18 in the transmission amplifier 1 and a power measuring unit 28 in the transmission amplifier 2. On the other hand, different symbols are used for gain control units 19 and 29 because the gain control units 19 and 29 partially differ in capabilities from the gain control units 15 and 25 of the transmission amplifying apparatus 100.

The power measuring unit 18 (28) finds the power value (input level) of the signal input to the modulation unit 10 (20), imparting the found power value to the gain control unit 19 (29).

Although the gain control unit 19 (29) performs the gain control (gain reduction and restoration control) at the time of detection of a fault, at the time of removal/attachment of a transmission amplifier, at power-up of the attached transmission amplifier, etc. as with the gain control unit 15 (25), the gain control unit 19 (29) differs from the gain control unit 15 (25) in that the gain control unit 19 (29) performs the gain control in response to the power value imparted from the power measuring unit 18 (28).

More specifically, the gain control can be performed by the following two different methods, i.e., first and second methods.

The first method consists of keeping the gain unreduced if the power value of the power measuring unit 18 (28) is lower than a given threshold value and raising the gain if the power value is higher than the given threshold value at the time of detection of a fault, at the time of removal/attachment of a transmission amplifier, at power-up of the attached transmission amplifier and so on. The given threshold value is, for example, the input level at the boundary between the linear and nonlinear regions of the AMP 16 and/or 26, and set in the gain control units 15 and 25 in advance.

This ensures that the signal with a level subject to amplification in the linear region by the AMP is not attenuated and that the signal with a level subject to amplification in the nonlinear region by the AMP is attenuated. In the nonlinear region where a distortion component is added by the AMP, therefore, attenuation of the signal power suppresses the distortion component. In the linear region where a distortion component is not added by the AMP, on the other hand, the signal can be transmitted without attenuating the signal power. This minimizes variations in the transmission output level, maintaining the communication condition stable.

The second method consists of rendering the decline in gain (attenuation amount) variable in response to the transmission power at the time of detection of a fault, at the time of removal/attachment of a transmission amplifier, at power-up of the attached transmission amplifier, etc. For example, if the power value of the power measuring unit 18 (28) has an input level in the nonlinear region of the AMP, the decline in gain is set proportionally to the power value. When the power value has an input level in the linear region of the AMP, the decline in gain is set to 0 (that is, no attenuation).

This changes the attenuation amount in response to the magnitude of the distortion component for more efficient suppression of the distortion component, minimizing variations in the transmission output level and maintaining the communication condition stable.

It is to be noted that the gain control units 15 and 25 can find the decline in gain proportional to the power value from a preset calculation formula or from a preset table associating power values with declines in gain.

<Third Embodiment>

In the aforementioned first and second embodiments, the gain can be gradually restored to the steady value after the gain reduction control.

Figure 4:
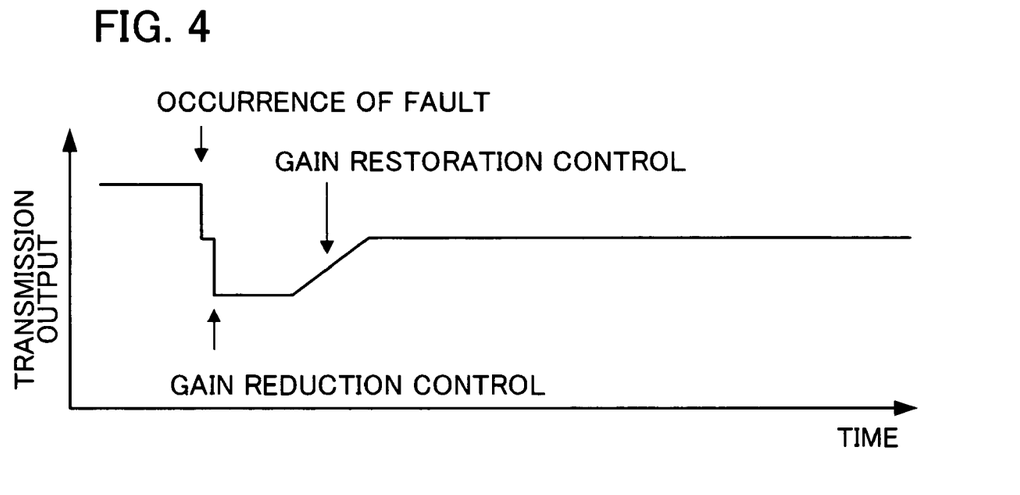
FIG. 4 is a graph showing changes in the transmission output from the combiner before and after a fault in a third embodiment of the present invention.

FIG. 4 is a graph showing changes in the transmission output (power value) from the combiner 4 before and after a fault in a third embodiment of the present invention. The transmission output declines by a constant value (e.g., 6 dB) immediately after the fault, as with the graph in FIG. 2. Thereafter, the transmission power diminishes as a result of the gain reduction control by the gain control unit 15 or 25 on the used side. The gain control unit 15 or 25 gradually restores the gain to the steady value over a constant time period, instead of doing so immediately, after the given time elapses from the gain reduction control.

This suppresses spectrum spreading of the transmission signal at the time of restoration of the gain to the steady value. As a result, the communication stability can be maintained while at the same time preventing degradation in the communication quality.

<Fourth Embodiment>

Figure 5:
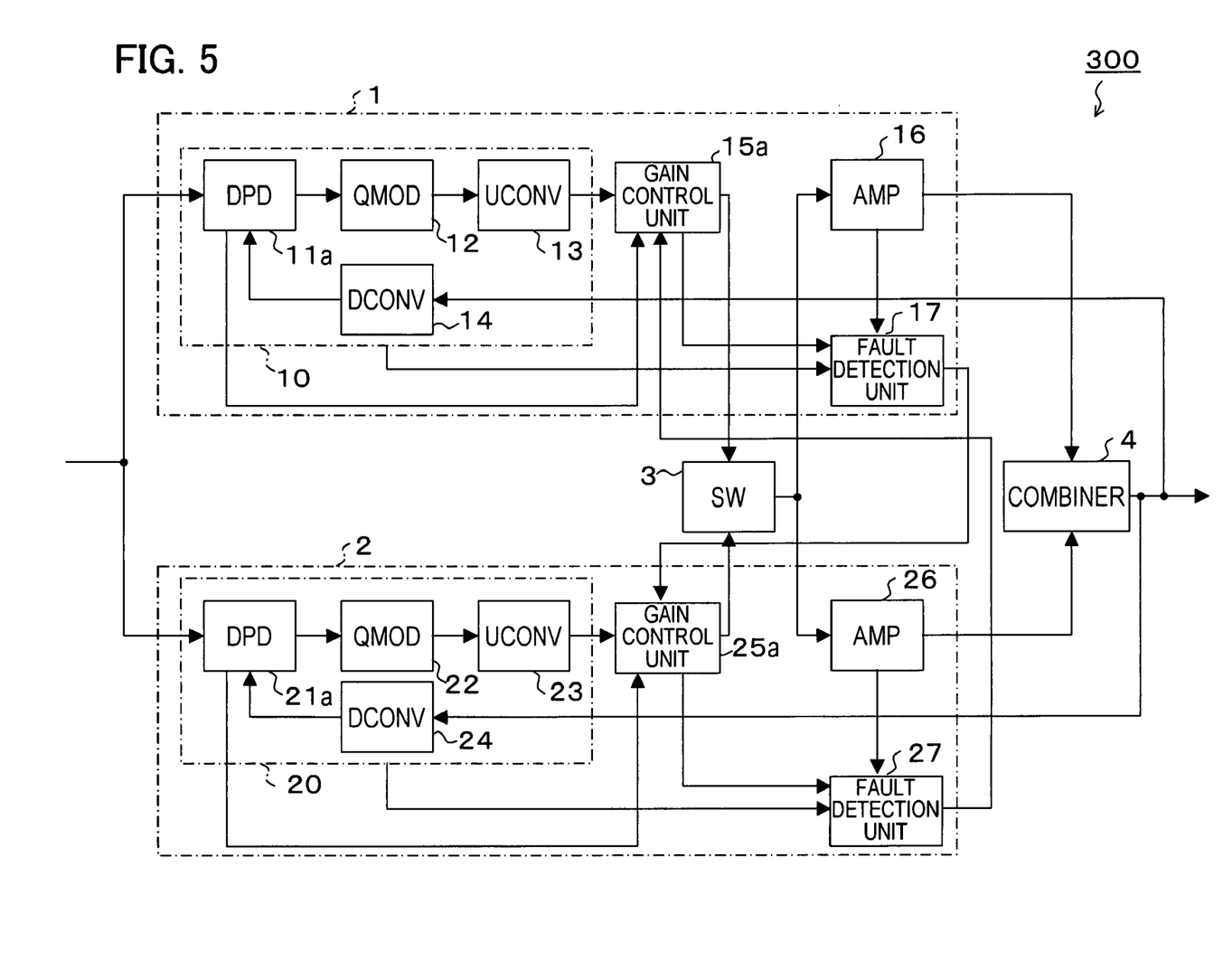
FIG. 5 is a block diagram showing a configuration of the transmission amplifying apparatus according to a fourth embodiment of the present invention.

The gain can be restored to the steady value in a step-by-step manner after the gain reduction control. FIG. 5 is a block diagram showing a configuration of a transmission amplifying apparatus 300 according to a fourth embodiment of the present invention for restoring the gain in a step-by-step manner. The same symbols are used for the same components as those of the transmission amplifying apparatus 100 according to the first embodiment described earlier, and the description of the components will be omitted.

Different symbols are used for DPDs 11a and 21a and gain control units 15a and 25a of the transmission amplifying apparatus 300 because these components partially differ in capabilities from the corresponding components of the transmission amplifying apparatus 100.

The DPD 11a (21a) not only performs the predistortion as with the DPD 11 (21) but also judges, during the gain restoration control for restoring the gain in a step-by-step manner following the gain reduction control, whether the distortion component in the feedback signal imparted from the combiner 4 has converged below a given level, imparting a signal (convergence signal) to the gain control unit 15a (25a) to notify of the convergence when the distortion component has converged below the given level.

The gain control unit 15a (25a) performs the gain reduction control as with the gain control unit 15 (25) and restores the gain in a step-by-step manner during the gain restoration control for restoring the gain to the steady value. The trigger for restoring the gain in a step-by-step manner is the input of the convergence signal. That is, each time the convergence signal is input, the gain control unit 15a (25a) brings the gain close to the steady value by a preset increment in a step-by-step manner.

Assuming that the decline in the transmission output by the gain reduction control is P (P>0) and that P÷n=p (n:integer equal to or greater than 2), the gain control unit 15a (25a) raises the gain (that is, brings the gain closer to the steady value) the given time after the gain reduction control such that the transmission output increases by p. This leads to a slight increase in the distortion component due to the AMP 16 and/or 26 in the output signal of the combiner 4, and therefore, the DPD 11a (21a) finds an appropriate distortion compensation value, thus causing the distortion component to diminish gradually.

Once the distortion component converges below the given level, the DPD 11a (21a) imparts the convergence signal to the gain control unit 15a (25a). Using the input of the convergence signal as a trigger, the gain control unit 15a (25a) raises the gain again such that the transmission output increases by p. These processings are repeated until the gain is restored to the steady value.

Figure 6:
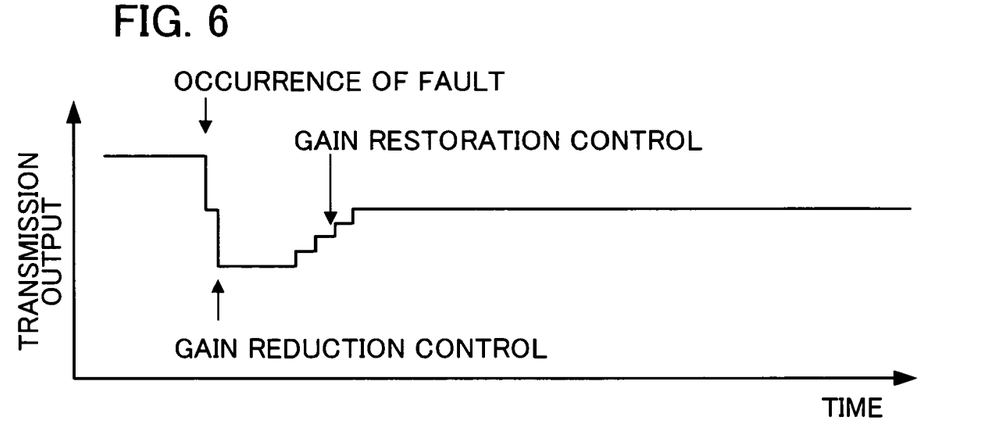
FIG. 6 is a graph showing changes in the transmission output from the combiner before and after a fault in the fourth embodiment of the present invention.

FIG. 6 is a graph showing changes in the transmission output from the combiner 4 before and after a fault in the fourth embodiment. Since the gain is restored in a step-by-step manner in the given time T after the gain reduction control, the transmission output from the combiner 4 rises in a step-by-step manner accordingly.

In this manner, according to the present embodiment, the gain is restored while at the same time verifying the convergence of the distortion control, thus preventing degradation in the communication quality (radio wave quality).

It is to be noted that the value 'n' is preferably a value that keeps noise—noise imparted to the adjacent channels by the distortion component caused by increasing the transmission output by p—within the allowable range. On the other hand, the transmission power may be increased by increments different from one another or p1, p2, . . . , and pn, instead of increasing the transmission power by the constant increment p.

This step-by-step gain restoration control is also applicable to the transmission amplifying apparatus 200 according to the second embodiment.

<OTHER EMBODIMENT>

While in the above-described embodiments, the gain control units 15 and 25 are provided respectively in the transmission amplifiers 1 and 2, a single gain control unit may be provided at the output side of a SW 5 in place of these two gain control units 15 and 25.

On the other hand, while in the second embodiment, the power measuring units 18 and 28 are provided for respectively measuring the input signals of the transmission amplifiers 1 and 2, power measuring units may be provided for measuring the power of the output signals of the AMPs 16 and 26 in place of the power measuring units 18 and 28. The gain control units 19 and 29 may perform the gain control in response to the power of the output signals.

INDUSTRIAL APPLICABILITY

The present invention is applicable to an amplifying apparatus for amplifying a signal, and applicable, for example, to an amplifying apparatus for amplifying a transmission signal to a mobile communication terminal in a base station of a mobile communication system.

According to the present invention, the distortion component in the output signals of the amplifiers can be suppressed in a transient state—in the transition from the state where both of the amplifiers operate to the state where either of the amplifiers operates, in the transition from the state where either of the amplifiers operates to the state where both of the amplifiers operate, at the time of removal of either of the amplifiers, at the time of attachment of the removed amplifier or at the time of switching from one modulation unit (including the predistorter) to another modulation unit (including the predistorter).

The invention claimed is:

1. An amplifying apparatus comprising:
two transmission amplifiers; and
a combiner for combining output signals of the two transmission amplifiers and for outputting a combined signal,
wherein each transmission amplifier includes:
a predistortion unit for determining a distortion compensation component based on the output signal of the combiner, and for predistorting an input signal of the transmission amplifier based on the determined distortion compensation component; and
a gain control unit for attenuating the predistorted input signal to set lower than in the steady state by reducing the gain lower than a steady value in the transition from the state where both of the transmission amplifiers operate to the state where either of the transmission amplifiers operates, or in the transition from the state where either of the transmission amplifiers operates to the state where both of the amplifiers operate, or at the time of removal of either of the transmission amplifiers, or at the time of attachment of the removed transmission amplifier an amplifier for receiving the attenuated predistorted input signal and for outputting an amplified signal.

2. The amplifying apparatus of claim 1, wherein the gain control unit attenuates the predistorted input signal to set lower than in the steady state if power of the input signal or power of the output signal of the combiner is greater than a given value in the transition from the state where both of the transmission amplifiers operate to the state where either of the transmission amplifiers operates, or in the transition from the state where either of the transmission amplifiers operates to We state where both of the transmission amplifiers operate, or at the time of removal of either of the transmission amplifiers, or at the time of attachment of the removed transmission amplifier.

3. The amplifying apparatus of claim 2, wherein the given value is a power value of the input signal at the boundary between the linear and nonlinear regions of the amplification characteristic of the transmission amplifiers in operation.

4. The amplifying apparatus of claim 1, wherein the gain control unit changes the amount of decline in the gain in response to the power of the predistorted input signal or the power of the output signal of the combiner in the transition from the state where both of the transmission amplifiers operate to the state where either of the transmission amplifiers operates, or in the transition from the state where either of the transmission amplifiers operates to the state where both of the transmission amplifiers operate, or at the time of removal of either of the transmission amplifiers, or at the time of attachment of the removed amplifier.

5. The amplifying apparatus of claim 1, wherein the gain control unit restores the gain to the steady value after a lapse of a given time after reducing the gain lower than the steady value.

6. The amplifying apparatus of claim 5, wherein the gain control unit restores the gain to the steady value in a stepwise manner.

7. The amplifying apparatus of claim 5, wherein the gain control unit restores the gain to the steady value by repeating a plurality of times the steps of first restoring the gain by a given value that is smaller than the difference between the reduced value and the steady value and then restoring the gain again by the given value when the distortion component contained in the output signal of the combiner converges into an allowable range.

8. The amplifying apparatus of claim 5, wherein the given time is a time required for the distortion component contained in the output signal of the combiner to converge into the allowable range.

9. The amplifying apparatus of claim 1, farther comprising two fault detection units each for imparting a fault detection signal to the gain control unit in the event of detection of a fault, wherein the gain control unit reduces the gain lower than the steady value upon receiving the fault detection signal.

10. An amplifying apparatus comprising:
two amplifiers for receiving selected signals in common and for outputting their respective amplified signals;
a combiner for combining the output signals of the two amplifiers and for outputting a combined signal;
two predistortion units each for determining a distortion compensation component based on the output signal of the combiner, and for predistorting input signal based on the determined distortion compensation component;
a switch unit for selecting one of output signals of the two predistortion units and for supplying the selected output signal to the two amplifiers in common; and
a gain control unit for attenuating the signals input to the switch to set lower than in the steady state by reducing the gain lower than a steady value when changing over the switch unit from one of the predistortion units to the other.

11. An amplifying apparatus comprising:
two amplifying units;
a combiner for combining output signals of the two amplifying units and for outputting a combined signal; and
a switch unit,
each of the two amplifying units including:
a main amplifier;
a digital predistoner disposed at the input side of the main amplifier, and for generating a predictive distortion value of the main amplifier and for adding the generated predictive distortion value to input signals;
a quadrature modulator for quadrature-modulating an output signal of the digital predistorter;
an upconverter for converting the frequency of an output signal of the quadrature modulator;
a downconverter for converting the frequency of an output signal of the combiner and for imparting the frequency-converted output signal of the combiner to the digital predistorter, and
a gain control unit for receiving an output signal of the upconverter as input, and for attenuating the input signal to the gain control unit to set lower than in the steady state by reducing the gain lower than a steady value in the transition from the state where both of the amplifying units operate to the state where either of the amplifying units operates, or in the transition from the state where either of the amplifying units operates to the state where both of the amplifying units operate, or at the time of removal of either of the amplifying units, or at the time of attachment of the removed amplifying unit, or at the time of changing over of the switch unit from one predistortion unit to the other predistortion unit,
wherein the switch unit selects an output signal of one of the gain control units of the two transmission amplifying units and imparts the selected output signal to the main amplifiers in common.

* * * * *